United States Patent [19]
Jordan

[11] Patent Number: 5,208,559
[45] Date of Patent: May 4, 1993

[54] PULSE SHAPING SYSTEM FOR A PULSE WIDTH MODULATION SYSTEM

[75] Inventor: Edward P. Jordan, Greensboro, N.C.

[73] Assignee: Analog Devices, Inc., Norwood, Mass.

[21] Appl. No.: 890,948

[22] Filed: May 29, 1992

[51] Int. Cl.⁵ .................................................. H03K 7/08
[52] U.S. Cl. ..................................... 332/109; 375/22; 307/265
[58] Field of Search ........................ 332/109, 110, 111; 375/22; 328/58, 111, 112; 307/265, 266, 267

[56] References Cited

U.S. PATENT DOCUMENTS

| | | | |
|---|---|---|---|
| 4,891,828 | 1/1990 | Kawazoe | 307/265 X |
| 5,045,800 | 9/1991 | Kung | 307/265 X |
| 5,119,045 | 6/1992 | Sato | 332/109 |

*Primary Examiner*—Siegfried H. Grimm
*Attorney, Agent, or Firm*—Iandiorio & Dingman

[57] ABSTRACT

A pulse shaping system for a pulse width modulation system includes: a ramp generator for generating a ramp signal having a ramp portion and a rest portion; a latch signal generator providing a latch signal coincident with the ramp portion; an indicator circuit for indicating desired pulse width; a pulse edge modulator responsive to the ramp portion and to the indicator circuit for providing a pulse width modulated pulse having at least one of its edges modulated; and including one or both of a fill circuit and a blanking circuit. In response to an indication from the indicator circuit of a desired maximum pulse width, the fill circuit causes the latch signal and the pulse generated by the pulse edge modulator to be combined for producing a maximum width pulse at the full width of the latch signal and the ramp portion. In response to an indication from the indicator circuit of a desired zero pulse width, the blanking circuit causes inhibiting of the pulse generated by the pulse edge modulator during the period of the latch signal and the ramp portion, for producing a zero width pulse during the full period of the latch signal and coincident ramp portion.

6 Claims, 6 Drawing Sheets

PULSE SHAPING SYSTEM FOR A PULSE WIDTH MODULATION SYSTEM

FIELD OF INVENTION

This invention relates to a pulse shaping system for pulse width modulation system, and more particularly to such a pulse shaping system which embraces one or both of pulse filling and pulse blanking.

BACKGROUND OF INVENTION

In conventional pulse width modulation systems a ramp is intersected by two variable references to accomplish dual edge modulation (DEM), by a fixed and a variable reference for trailing edge modulation (TEM), and by a variable and a fixed reference for leading edge modulation (LEM). Generally such systems operate satisfactorily but inaccuracies and unreliability can occur at the extremes: when zero width pulses and maximum width pulses are generated. For example, when maximum width pulses are requested the full width available from the ramp cannot be utilized because there must be some overshoot of the ramp to intersect the reference. When zero width pulses are requested it is likewise difficult to rely on the ramp instantaneously responding to the references to emit absolutely no pulse: some small spikes may get through. Attempts to address these problems have resulted in the use of additional external circuits to fill and blank the pulses.

SUMMARY OF INVENTION

It is therefore an object of this invention to provide a pulse filling system for a pulse width modulation system which is simple, integral and assures a maximum pulse width to the full extent enabled by the ramps.

It is an equally important object of this invention to provide a pulse blanking system for a pulse width modulation system which is simple, integral and assures a zero width pulse.

It is a further object of this invention to provide such blank and fill systems usable in multiramp pulse width modulation systems such as dual-ramp systems providing a series of odd and even alternate sequential pulses for high-speed applications.

It is a further object of this invention to provide a pulse filling and blanking system for a pulse width modulation system.

It is a further object of this invention to provide such a blanking and filling system in which the blanked and filled pulses are inherently properly aligned and synchronized.

The invention results from the realization that a truly effective integrated, accurate, reliable and inherently aligned pulse filling and pulse blanking system for a pulse width modulation system can be achieved by using a latch signal coincident with the ramp portion of a ramp signal to define the full size of a maximum width pulse coincident with the full extent of the ramp portion and to define the full length of the blanking period for a zero width pulse for the full extent of the ramp portion.

This invention features a pulse shaping system for a pulse width modulation system which includes a ramp generator for generating a ramp signal having a ramp portion and a rest portion. There is a latch signal generating means for providing a latch signal coincident with the ramp portion of the ramp signal and means for indicating the desired width of a pulse to be generated. A pulse edge modulation means responsive to the ramp portion of the ramp signal and to the means for indicating provides a pulse with at least one of its edges modulated to achieve the desired width.

The pulse shaping system may include a filling circuit, a blanking circuit, or both. The fill circuit may include means responsive to the means for indicating for detecting that a maximum width pulse has been indicated, means responsive to the means for detecting for gating the latch signal when the means for detecting detects a maximum width pulse indication, and means responsive to the means for gating for combining the latch signal and the pulse generated by the pulse edge modulation means for producing a maximum width pulse at the full width of the latch signal and the ramp portion.

The blanking circuit may include means responsive to the means for indicating for detecting that a zero width pulse has been indicated; means responsive to the means for detecting for gating the latch signal when the means for detecting detects a zero width pulse indication; and means responsive to the means for gating for inhibiting the pulse generated by the pulse edge modulation means during the period of the latch signal and the ramp portion for producing a zero width pulse during the full period of the latch signal and coincident ramp portion.

DISCLOSURE OF PREFERRED EMBODIMENT

Other objects, features and advantages will occur to those skilled in the art from the following description of a preferred embodiment and the accompanying drawings, in which.

Figure 2:
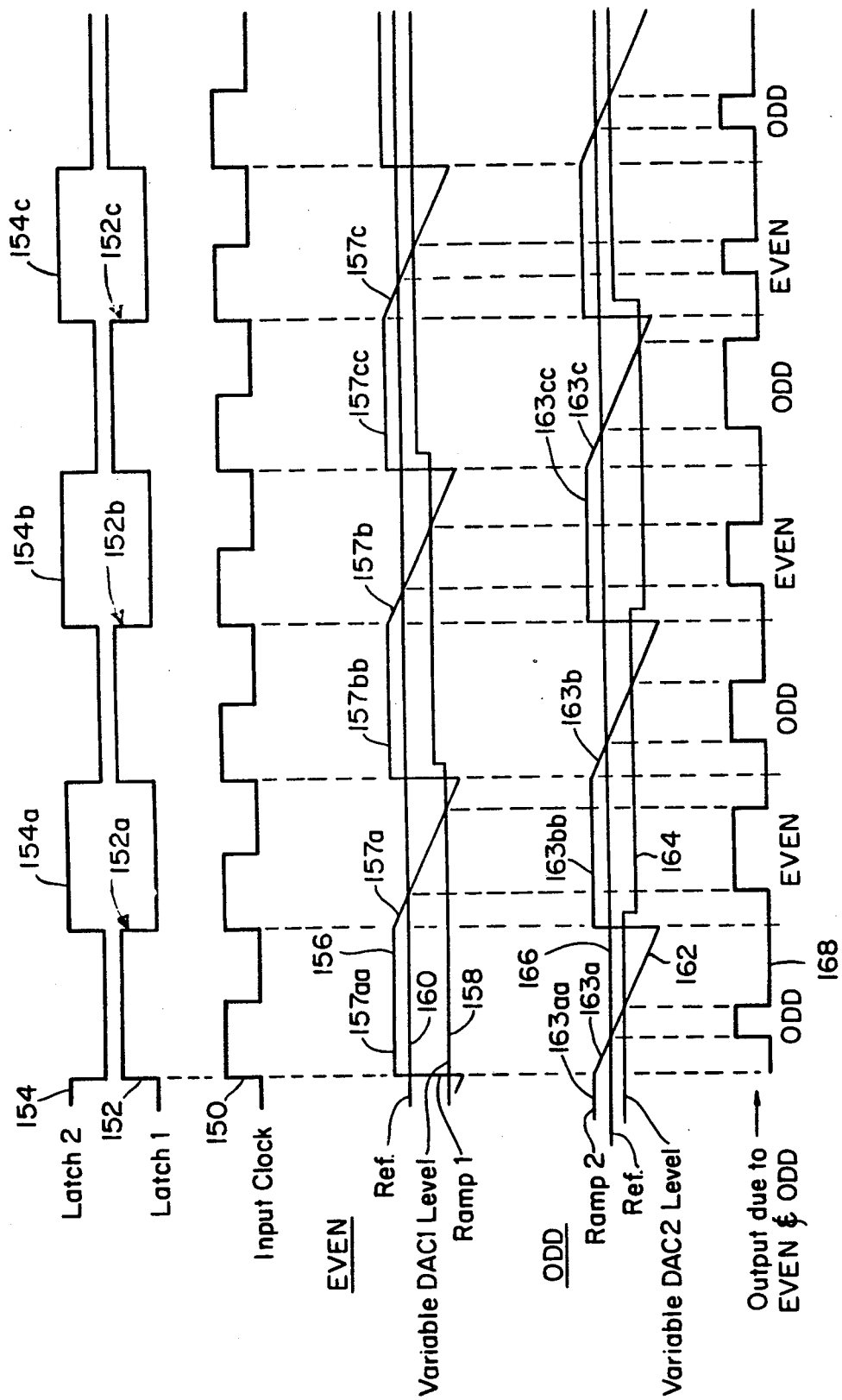
FIG. 2 is an illustration of the waveforms generated in the circuit of FIG. 1 when using two ramps to generate odd and even pulses.
Figure 3A:
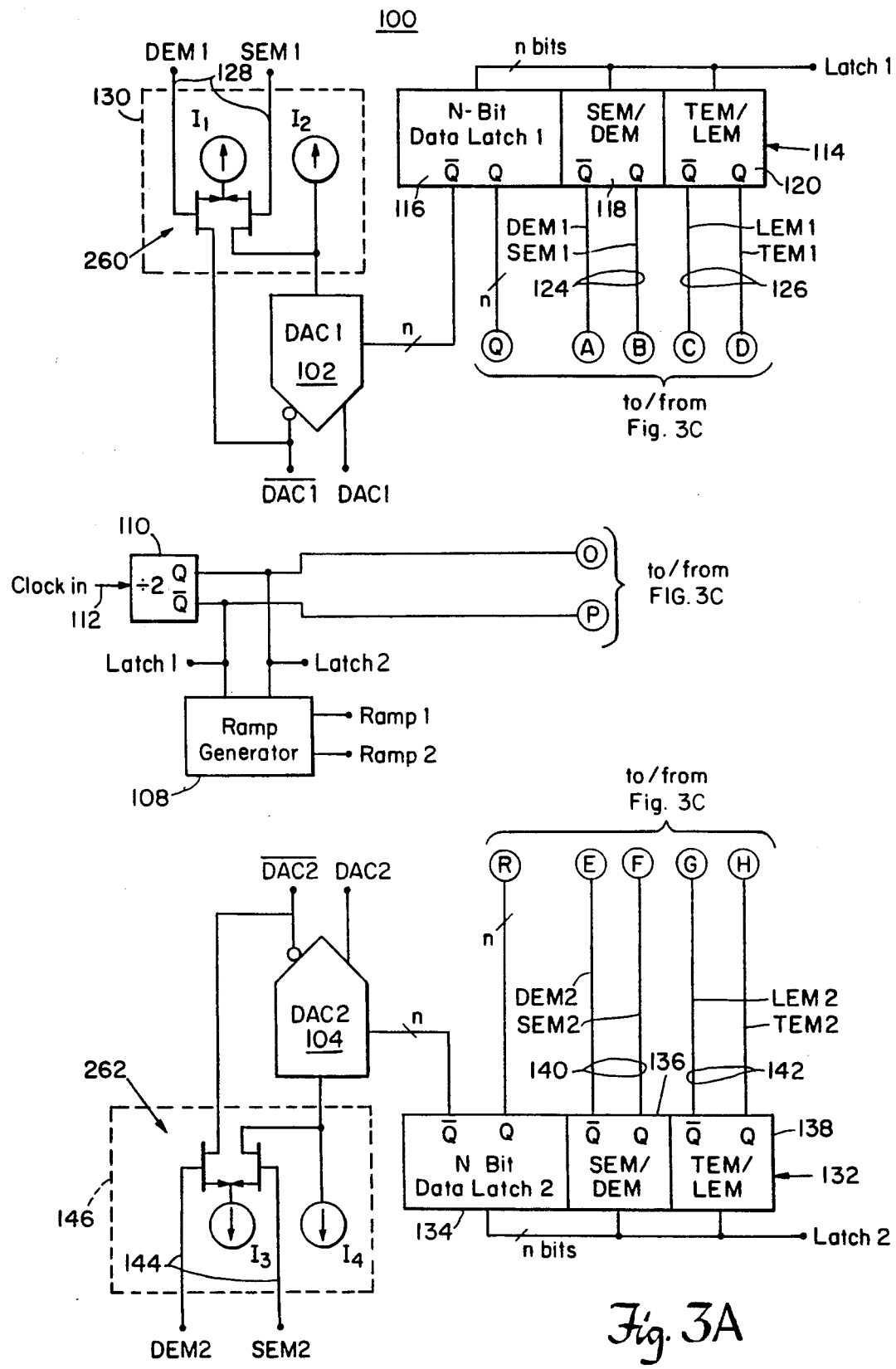
Figure 3B:
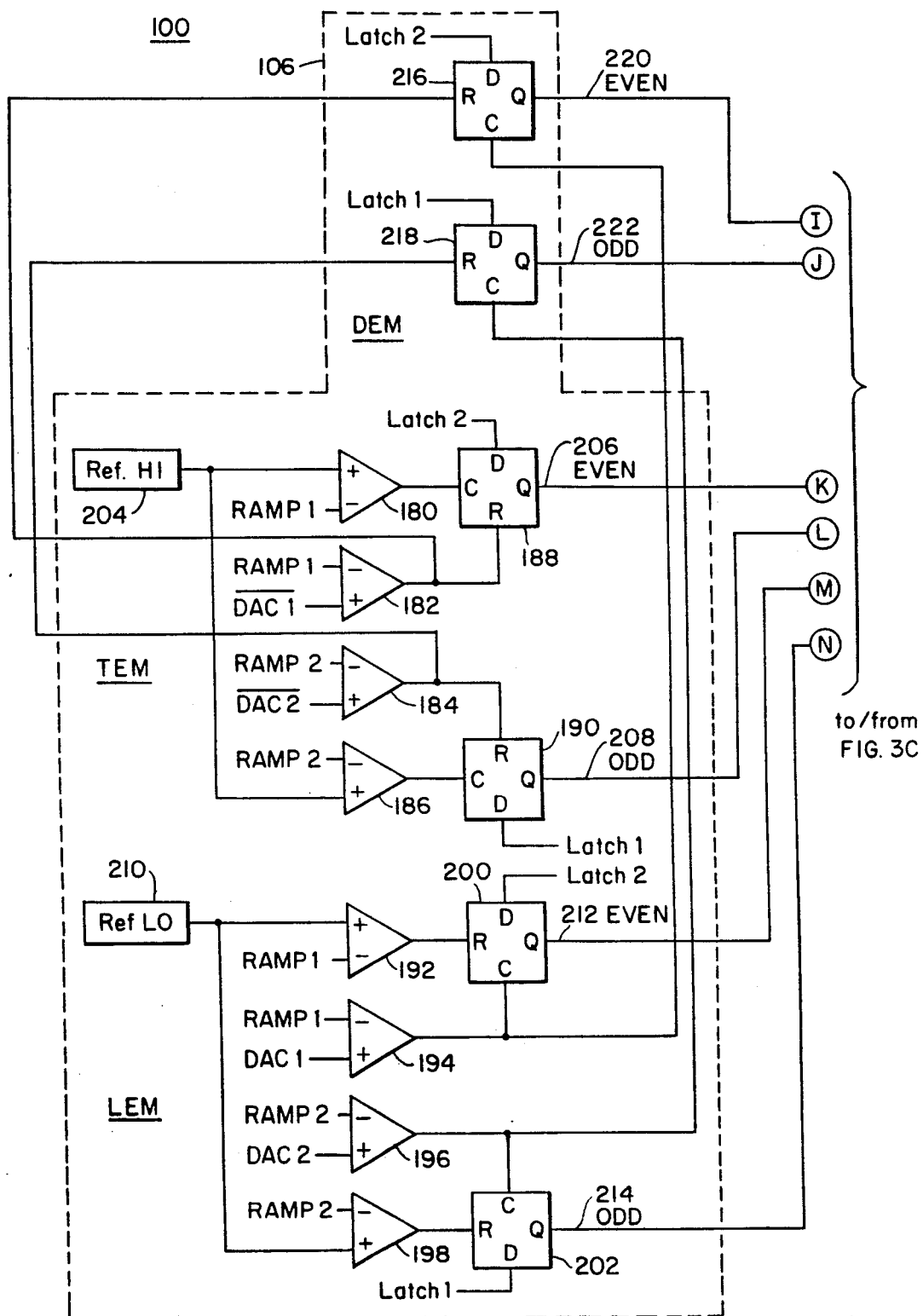
Figure 3C:
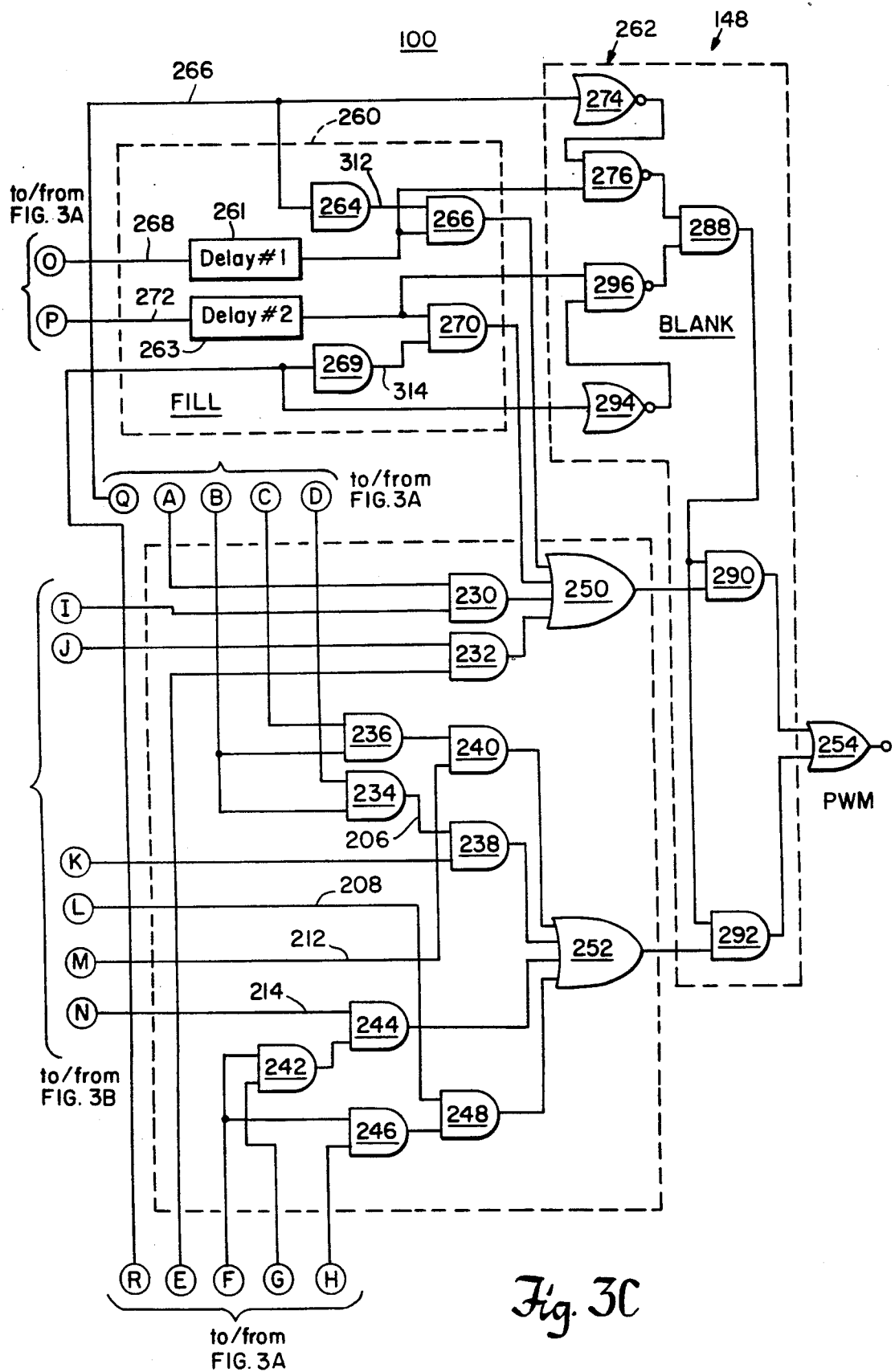
Figure 4:
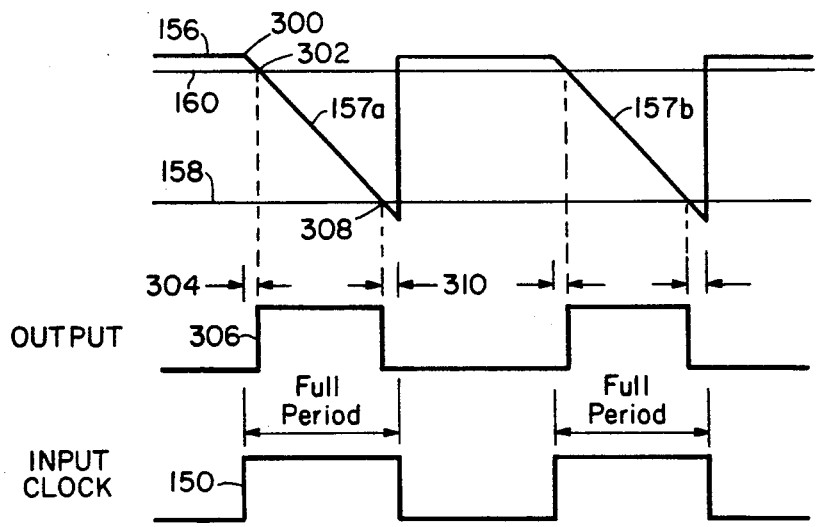
Figure 5:
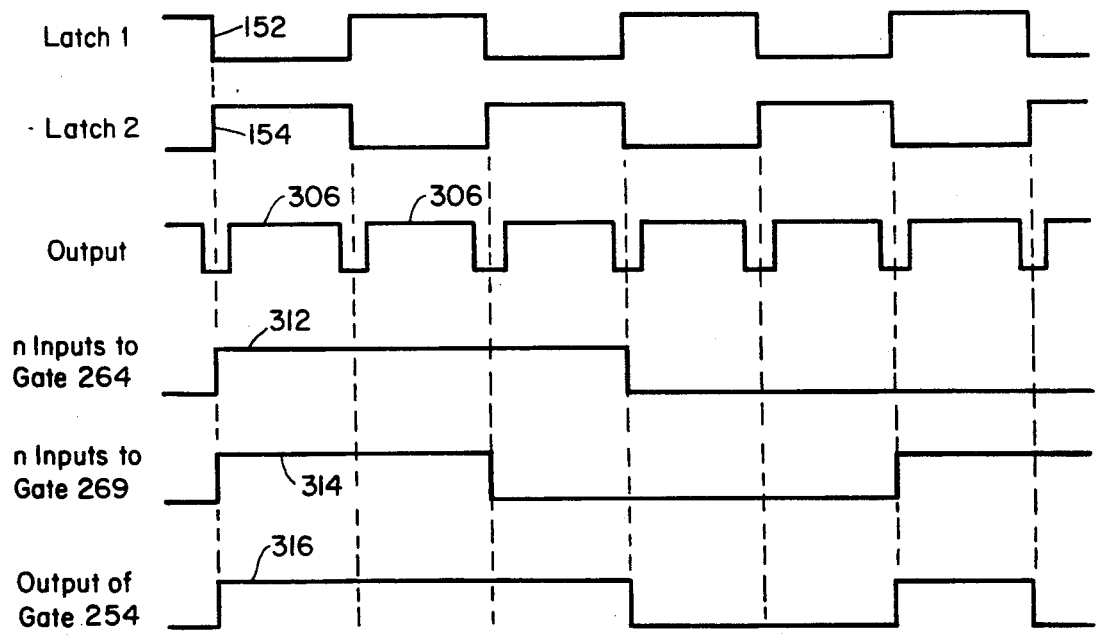

FIGS. 3A-3C together form a more detailed diagram of the system of FIG. 2;

FIG. 4 is an illustration showing failure to fill a pulse in a leading edge modulated system; and FIG. 5 illustrates a series of waveforms which occur pertinent to the operation of the fill circuit in FIG. 3.

This invention is accomplished in a pulse shaping system for a pulse width modulation system which utilizes a ramp generator for generating a ramp signal having a ramp portion and a rest portion. A latch signal generating means provides a latch signal which is coincident with the ramp portion of the ramp signal. There are some means for indicating the desired width of a pulse to be generated. For example, a register which holds an n bit word indicating the desired width of the pulse along with information as to whether the leading, the trailing, or both edges are to be modulated. This register operates a digital to analog converter which provides a variable reference for use with a fixed reference in LEM and TEM operations and two variable references for use in DEM operations. A pulse edge modulation network responds to the ramp portion of the ramp signal and to the n bit words and instructions in the register to provide a pulse with at least one of its edges modulated to achieve the desired width.

A fill circuit according to this invention includes means responsive to the means for indicating for detecting that a maximum width pulse has been indicated: for example, an n bit AND gate connected to the register. A second AND gate responsive to the first AND gate passes the latch signal to the output in combination with the requested DEM, LEM or TEM pulse so that the outputted pulse extends for the full duration of the ramp portion of the latch signal which is coincident with the ramp portion of the ramp signal. The blanking circuit includes some means such as a NOR gate which recognizes the presence of all zeroes indicating a zero width pulse is desired. When such a zero width request is detected, once again a latch signal is combined to inhibit the output from the pulse edge modulation means so that no pulse or a zero width pulse is produced at the output during the entire time of the latch signal coincident with the ramp portion of the ramp signal.

Figure 1:
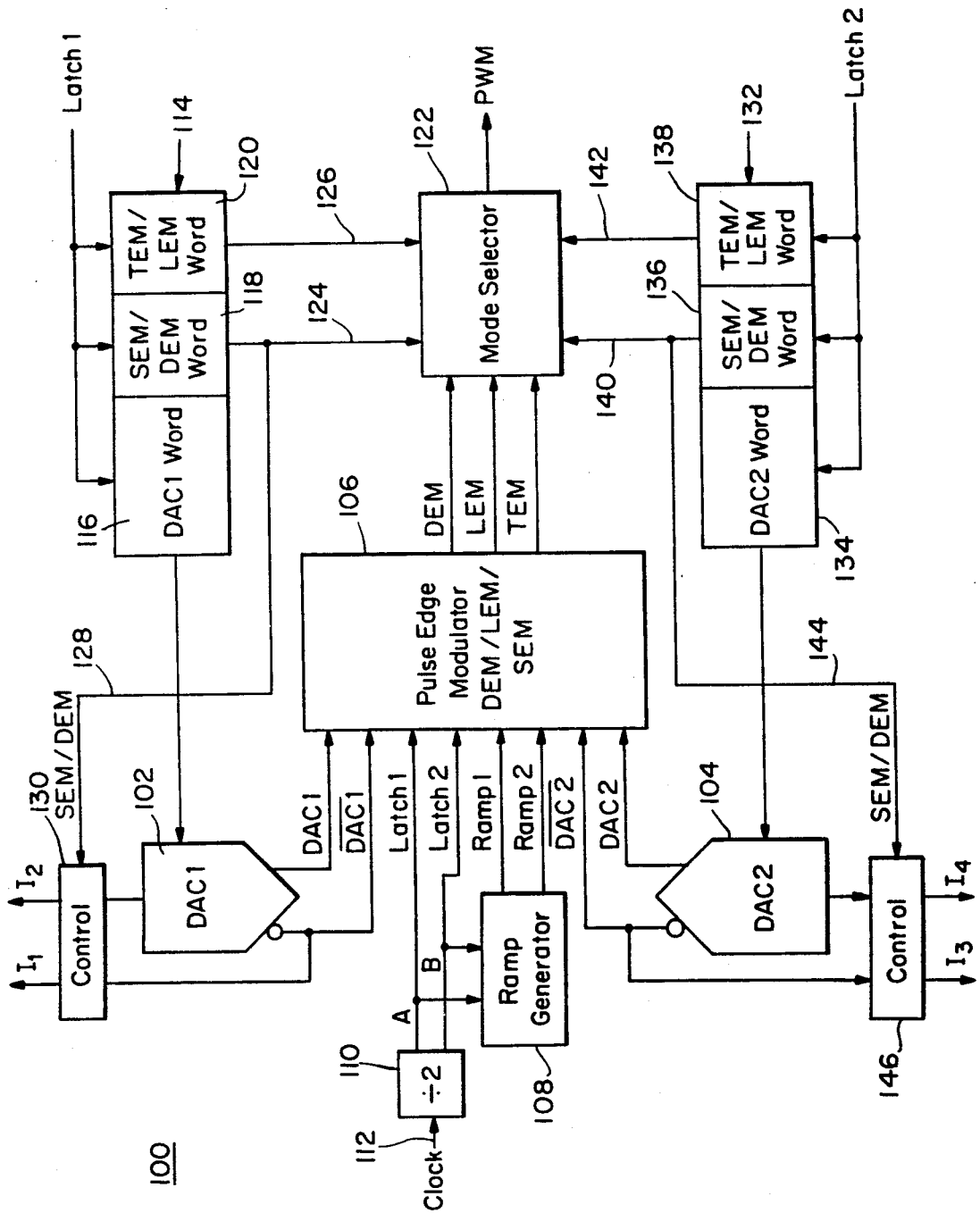
FIG. 1 is a block diagram of a high-speed pulse width modulation system using duplicate ramp digital to analog converters and control circuits to provide odd and even pulses during both halves of each clock cycle.

There is shown in FIG. 1 a pulse edge modulation system 100 employing the blank and fill circuits according to this invention. High-speed pulse width modulation system 100 employs two digital to analog converters 102 and 104 which can be used in conjunction with a pulse edge modulator 106 capable of generating any one of the three modes, DEM, LEM or TEM, so that all the pulses denominated odd and even can be generated sequentially during each half of the divide by two clock signal. Pulse edge modulator 106 receives the DAC1 and DAC1 outputs from digital to analog converter 102, the DAC2 and DAC2 outputs from digital to analog converter 104; and the two ramps, ramp 1 and ramp 2, from ramp generator 108 driven by divide by two circuit 110, which is enabled by the incoming clock signal on line 112. Pulse edge modulator 106 also receives latch 1 and latch 2 signals from the divide by two circuit 110. Latch circuit or register 114 is enabled by latch 1 to receive n bit DAC word 116. The n bit DAC word 116 causes converter 102 to establish the levels of DAC1 and DAC1. Latch 1 also causes to be loaded in register 114 the SEM/DEM word 118, which indicates whether a single-edge modulation (SEM) or dual edge modulation (DEM) is requested for the next pulse. At the same time, latch 1 causes the TEM/LEM word 120 to be loaded in register 114 to indicate which of the single edge modulation modes is selected if a single edge modulation has been requested by the SEM/DEM word 118. Thus while pulse edge modulator 106 is generating all three modes of modulation, DEM, LEM and TEM, only one will be selected by mode selector 122 in response to the SEM/DEM word input on line 124 and the TEM/LEM word input on line 126. The SEM/DEM word 118 is also provided over line 128 to control 130. If SEM/DEM word 118 indicates single edge modulation, then control 130 directs both currents $I_1$ and $I_2$ through converter 102. If SEM/DEM word 118 indicates dual edge modulation, then only the operating current $I_2$ is established through DAC1 and the bias current $I_1$ is drawn through DAC1. Converter 104 is similarly served by register 132 which contains DAC2 word 134, SEM/DEM word 136 and TEM/LEM word 138, all responsive to the latch 2 signal. SEM/DEM word 136 and TEM/LEM word 138 provide indications on lines 140 and 142 to mode selector 122 in the same manner as associated with register 114. Mode selector 122 under direction from registers 114, 132 selects the mode DEM, TEM, LEM to be outputted and may be considered as including registers 114 and 132. SEM/DEM word 136 provides an indication on line 144 to control circuit 146 which controls the operating current $I_4$ and biasing current $I_3$ for converter 104 in the same way as control 130 does with respect to converter 102.

Blank and fill circuit 148 responds to the DAC words 116 and 134 and the latch signals, latch 1 and latch 2, to either blank or fill the output pulse depending upon whether a zero pulse width or maximum pulse width has been requested. This is explained more fully with respect to FIG. 3C.

The various signals occurring in FIG. 1 are shown in FIG. 2. The input clock 150 which appears on line 112 is used to generate latch 1 signal 152 and latch 2 signal 154 during alternate halves of the divide by two input clock cycle. For a simple generation of trailing edge modulated pulses, the even pulses are generated by ramp 1 156 in conjunction with the variable DAC1 level 158 and a fixed reference level 160 which may be supplied externally or generated internally of pulse edge modulator 106. Ramp 1 156 includes ramp portions 157a, b, c and rest portions 157 aa, bb, cc. The odd pulses are generated using ramp 2 162 in conjunction with the variable DAC2 level 164 and reference 166. Ramp 2 162 includes ramp portions 163a, b, c and rest portions 163aa, bb, cc. The resulting series of pulse width modulated pulses is indicated at the series of waveforms labelled 168. Ramp 2 start is connected to latch 1 and ramp 1 start is connected to latch 2. Latch 2 is loaded while ramp 1 is active, and latch 1 is loaded while ramp 2 is active.

The pulse edge modulator 106, mode selector 122, and blank and fill circuit 148 of system 100 are shown in greater detail in FIGS. 3A–3C. Pulse edge modulator 106 includes two sets of four comparators. The upper set of comparators 180, 182, 184 186 are used in conjunction with flip-flops or latches 188 and 190 to generate trailing edge modulation (TEM). The lower four comparators 192, 194, 196 and 198 are used in conjunction with latches or flip-flops 200 and 202 to generate leading edge modulation (LEM). Comparator 180 compares the reference input from high reference circuit 204 and ramp 1 to set flip-flop 188 at its input C to establish the fixed leading edge of a TEM pulse. Flip-flop 188 is reset at its input R by the output from comparator 182 which which responds to ramp 1 and to the DAC1 input to define the variable trailing edge of the TEM pulse. The Q output of flip-flop 188 on line 206 thus produces the even pulse in the odd-even set. Flip-flop 188 is enabled to produce such a pulse only during the latch 2 period when the latch 2 signal is present at the D input. The odd pulse for the DEM is produced by flip-flop 190 on line 208 during the latch 1 period when the latch 1 signal is present at the D input to flip-flop 190 and flip-flop 190 is set by comparator 186 which responds to the high reference from reference circuit 204 and ramp 2. Flip-flop 190 is reset by comparator 184 which responds to the ramp 2 and the DAC2 signal.

Comparator 194 responds to the ramp 1 and DAC1 signals to set flip-flop 200 and define the variable leading edge of the even pulse while comparator 192 responds to the low reference level from low reference circuit 210 and ramp 1 to reset flip-flop 200 and thereby define the even LEM pulse on line 212. Comparator 196 responds to ramp 2 and DAC 2 to set flip-flop 202 defining the variable leading edge of the pulse produced by flip-flop 202 on line 214. This odd pulse on line 214 occurs during the period while flip-flop 202 is enabled.

For dual edge modulation, even latch 216 and odd latch 218 are used. Even latch 216 is set by the output from comparator 194 and reset by the output from comparator 182 to define the variable positions of the leading and the trailing edge of the even pulse provided on line 220. Latch 218 is set by the output of comparator 196 and reset by the output of comparator 184 to define the variable leading and trailing edges of the DEM odd pulse on line 222. In this way, only two ramps are used to constantly generate all three modes of modulation which can be selected in any mix of modes: that is, LEM, TEM and DEM can be selected in any order for even and/or odd pulses, and since they are always present, no synchronization problems occur when one of them is selected by mode selector 122. Pulse edge modulator means 106 may be considered as including DACs 102, 104, registers 114, 132, and controls 130, 146.

Mode selector 122 includes two AND gates 230 and 232 associated with DEM latches 216, 218, four AND gates 234, 238, 240 and 248 associated with TEM latches 188 and 190, and four AND gates 242, 244, 236 and 240 associated with LEM latches 200 and 202. These AND gates feed two OR gates 250 and 252 which feed the final OR gate 254. AND gate 230 is enabled to pass the even pulse on line 220 when the $\overline{Q}$ output is high from word 118 in register 114, indicating that dual edge modulation and not single edge modulation has been chosen. Similarly, AND gate 232 is enabled to pass the odd pulse on line 222 when the $\overline{Q}$ pulse is high in word 136 of register 132. If either one of these AND gates is enabled, then their respective odd or even pulse will be passed to OR gate 250 and on to output OR gate 254.

If in contrast the Q output of SEM/DEM word 118 in register 114 is enabled, then one output is provided to each of AND gates 234 and 236. One of these two AND gates is then enabled depending upon whether the $\overline{Q}$ LEM1, or Q TEM1 outputs of word 120 are high in register 114. If AND gate 236 is enabled, it in turn enables AND gate 240 to pass the even pulse on line 212. If instead AND gate 234 is enabled, then it enables AND gate 238 to pass the even pulse on line 206. In either case, one of those pulses reaches OR gate 252 and is passed to the final output OR gate 254.

In a similar manner, the Q outputs from word 136 in register 132 provide one output to each of AND gates 242 and 246 depending upon whether the $\overline{Q}$ LEM2 output or the Q TEM2 output is high. One of those two gates 242 or 246 will have an output. If 242 has an output it enables AND gate 244 to pass the odd pulse on line 214. If AND gate 246 has an output it enables AND gate 248 to pass the odd pulse on line 208. In either case one of the signals is presented at OR gate 252 from where it is delivered to output OR gate 254.

The switching function of control 130 may be implemented using a differential switch 260. A SEM1 signal causes $I_1$ to be paralleled with $I_2$. A DEM1 output causes $I_1$ to be established with the DAC1 output of converter 102. In a similar manner, differential circuit 262 in control 146 associated with converter 104 operates to control the path of current $I_3$.

Blank and fill circuit 148 is shown including two separate sections, fill circuit 260 and blank circuit 262. Fill circuit 260 includes a multiple input AND gate 264, which receives at its input all outputs on line 266 from word 116 in register 114. When all n bits are one, indicating a maximum width pulse has been requested, AND gate 264 provides a one output to AND gate 266. This enables AND gate 266 to pass the latch 2 signal on line 268 to OR gate 250. AND gate 269 functions similarly to AND gate 264 with respect to word 134 in register 132. When AND gate 269 receives a one at all of its n inputs, it enables AND gate 270 to pass latch 1 signal on line 272 to OR gate 250. In either case, then, when a maximum pulse width has been requested in either register 114 or 132, a latch signal extending for the full extent coincident with the ramp portion of the ramp signal, is present at OR gate 250. The output of OR gate 250 will therefore be high during the entire period of the latch signal coincident with the ramp portion of the ramp signal. Since both OR gate 250 and OR gate 252 are connected to output OR gate 254, it can be seen that the full length pulse from either AND gate 266 or 270 will dominate the output so that a pulse will be present at the output of OR gate 254 for the full time of the ramp portion of the ramp signal, regardless of whether the DEM output from AND gates 230 and 232, or the TEM and LEM outputs to OR gate 252, are less than the full extent of that period. Of course, only one of the outputs, DEM, LEM or TEM, will have been selected as explained previously. Fill circuit 260 includes delay 1 261 and delay 2 263. Each of the delays 261, 263 equals the delay through one comparator and one flip-flop. For example, comparator 180 and latch 188 delay the output from ramp 1. Delays 1 and 2 delay the latch 1 and latch 2 signals so that they line up with the outputs of latches 216, 218, 188, 190, 200 and 202.

Blanking circuit 262 includes NOR gate 274, whose output will be one when all its inputs are zero, indicating that a zero width pulse has been requested. When the output of NOR gate 274 is one and latch 2 is high, then the output of NAND gate 276 will also be zero. This inhibits the operation of AND gate 288 whose output is then zero. Zero output from AND gate 288 disables both AND gates 290 and 292 so that a zero pulse is provided to the output OR gate 254. This occurs, however, only for the period of the latch 2 signal on line 268, because as soon as that latch signal ends, NAND gate 276 will have a zero at its other input, causing its output to now switch from zero to one. The similar operation with respect to OR gate 294 and NAND gate 296 associated with register 132 results in AND gate 288 having both inputs present which then provides the enabling input to AND gates 290 and 292 to end the zero output and enable the next pulse, whatever its width may be, to be transmitted through AND gates 290 or 292 to output OR gate 254.

In contrast, if any one of the n bits in register 116 is a one, then NOR gate 274 will have a zero output. The zero output in conjunction with the one output from latch 2 on line 268 during that latch 2 period causes NAND gate 276 to have a one output. Similarly, when any one of the outputs on line 266 from register 114 is not a zero, then the output of NOR gate 274 is a zero. This causes the output of NAND gate 276 to be a one, which enables AND gate 288 whose output in turn enables AND gates 290 and 292, to pass unaffected, whatever pulses are being provided by OR gates 250 and 252. OR gate 294 responds to word 134 in register 132 to operate NAND gate 296 in the same fashion as with NOR gate 274 and NAND gate 276.

OR gates 250, 252 and 254 function both as a part of the pulse edge modulation circuit 106 and as a part of the fill and blank circuits 260 and 262. While the fill and blank circuits are shown as separate circuits, this is not a necessary limitation of the invention. For example, a single means could replace the gates such as 264, 274, 266 and 276, which would detect both either extremes, zero and maximum, and appropriately pass the latch signal to the inhibiting or combining gates.

The problem addressed by this invention is explained with respect to FIG. 4, where it can be seen that the delay between the beginning 300 of ramp portion 157a and the intersection at 302 with reference 160 causes a shrinking indicated at 304 of the leading edge of output pulse 306, and the overshoot at 308 of ramp portion 157a produces a shrinking indicated at 310 of the trailing edge of output pulse 306, so that the output pulse 306, which should be a maximum width, is less than that theoretically available from ramp portion 157a as defined by the full clock period of input clock signal 150.

In accordance with this invention, using the available latch signals, latch 1 152 and latch 2 154, FIG. 5, the shrunken output pulses 306 are filled as a result of the presence of n inputs to gate 264 which passes the latch 2 signal on line 268 While the output 312 from gate 264 is high, the output 314 from gate 269 is low, resulting in the output of gate 250 being a maximum pulse which extends for the full latch period coincident with the ramp portion of the ramp signal 316.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A pulse shaping system for a pulse width modulation system comprising:
   ramp generator means for generating a ramp signal having a ramp portion and a rest portion;
   latch signal generating means for providing a latch signal coincident with the ramp portion of said ramp signal;
   means for indicating the desired width of a pulse to be generated;
   pulse edge modulation means, responsive to said ramp portion of said ramp signal and to said means for indicating for providing a pulse with at least one edge modulated to achieve the desired width;
   a fill circuit including means, responsive to said means for indicating, for detecting that a maximum width pulse has been indicated, means, responsive to said means for detecting, for gating said latch signal when said means for detecting detects a maximum width pulse indication, and means, responsive to said means for gating, for combining said latch signal and the pulse generated by said pulse edge modulation means for producing a maximum width pulse at the full width of the latch signal and said ramp portion.

2. A pulse shaping system for a pulse width modulation system comprising:
   ramp generator means for generating a ramp signal having a ramp portion and a rest portion;
   latch signal generating means for providing a latch signal coincident with the ramp portion of said ramp signal;
   means for indicating the desired width of a pulse to be generated;
   pulse edge modulation means, responsive to said ramp portion of said ramp signal and to said means for indicating or providing a pulse with at least one edge modulated to achieve the desired width;
   a blanking circuit including means, responsive to said means for indicating, for detecting that a zero width pulse has been indicated, means, responsive to said means for detecting, for gating said latch signal when said means for detecting detects a zero width pulse indication, and means, responsive to said means for gating, for inhibiting the pulse generated by said pulse edge modulation means during the period of said latch signal and said ramp portion for producing a zero width pulse during the full period of the latch signal and coincident said ramp portion.

3. A blank and fill system for a pulse width modulation system comprising:
   ramp generator means for generating a ramp signal having a ramp portion and a rest portion;
   latch signal generating means for providing a latch signal coincident with the ramp portion of said ramp signal;
   means for indicating the desired width of a pulse to be generated;
   pulse edge modulation means, responsive to said ramp portion of said ramp signal and to said means for indicating for providing a pulse with at least one edge modulated to achieve the desired width;
   a fill circuit including means, responsive to said means for indicating, for detecting that a maximum width pulse has been indicated, means, responsive to said means for detecting, for gating said latch signal when said means for detecting detects a maximum width pulse indication, and means, responsive to said means for gating, for combining said latch signal and the pulse generated by said pulse edge modulation means for producing a maximum width pulse at the full width of the latch signal and said ramp portion; and
   a blanking circuit including means, responsive to said means for indicating, for detecting that a zero width pulse has been indicated, means, responsive to said means for detecting, for gating said latch signal when said means for detecting detects a zero width pulse indication, and means, responsive to said means for gating, for inhibiting the pulse generated by said pulse edge modulation means during the period of said latch signal and said ramp portion for producing a zero width pulse during the full period of the latch signal and coincident said ramp portion.

4. A pulse shaping system for a pulse width modulation system comprising:
   ramp generator means for generating a number of ramp signals having a ramp portion and a rest portion;
   latch signal generating means for providing a corresponding number of latch signals each coincident with the ramp portion of a corresponding said ramp signal;
   means for indicating the desired widths of pulses to be generated from each ramp signal;
   pulse edge modulation means, responsive to said ramp portions of said ramp signals and to said means for indicating for providing pulses with at least one of their edges modulated to achieve the desired widths;
   a fill circuit including means, responsive to said mean for indicating, for detecting that a maximum width pulse has been indicated for generation from a ramp portion of a predetermined ramp signal; means, responsive to said means for detecting, for gating said latch signal corresponding to said predetermined ramp signal when said means for detecting detects a maximum width pulse indication; and means, responsive to said means for gating, for combining said latch signal and the corresponding pulse generated by said pulse edge modulation means for producing a maximum width pulse at the full width of the latch signal corresponding to the predetermined said ramp portion.

5. A pulse shaping system for a pulse width modulation system comprising:

ramp generator means for generating a number of ramp signals having a ramp portion and a rest portion;

latch signal generating means for providing a corresponding number of latch signals each coincident with the ramp portion of a corresponding said ramp signal;

means for indicating the desired width of a pulse to be generated from each ramp signal;

pulse edge modulation means, responsive to said ramp portion of said ramp signals and to said means for indicating for providing pulses with at least one of their edges modulated to achieve the desired widths;

a blanking circuit including means, responsive to said means for indicating, for detecting that a zero width pulse has been indicated for generation from a ramp portion of a predetermined ramp signal; means, responsive to said means for detecting, for gating said latch signal corresponding to said predetermined ramp signal when said means for detecting detects a zero width pulse indication, and means, responsive to said means for gating, for combining said latch signal and the corresponding pulse generated by said pulse edge modulation means during the period of said latch signal and said ramp portion for producing a zero width pulse during the full period of the latch signal and coincident said ramp portion of said predetermined ramp signal.

6. A pulse shaping system for a pulse width modulation system comprising:

ramp generator means for generating a number of ramp signals having a ramp portion and a rest portion;

latch signal generating means for providing a corresponding number of latch signals each coincident with the ramp portion of a corresponding said ramp signal;

means for indicating the desired widths of pulses to be generated from each ramp signal;

pulse edge modulation means, responsive to said ramp portions of said ramp signals and to said means for indicating for providing pulses with at least one of their edges modulated to achieve the desired widths;

a fill circuit including means, responsive to said means for indicating, for detecting that a maximum width pulse has been indicated for generation from a ramp portion of a predetermined ramp signal; means, responsive to said means for detecting, for gating said latch signal corresponding to said predetermined ramp signal when said means for detecting detects a maximum width pulse indication, and means, responsive to said means for gating, for combining said latch signal and the corresponding pulse generated by said pulse edge modulation means for producing a maximum width pulse at the full width of the latch signal corresponding to the predetermined said ramp portion; and a blanking circuit including means, responsive to said means for indicating, for detecting that a zero width pulse has been indicated for generation from a ramp portion of a predetermined ramp signal; means, responsive to said means for detecting, for gating said latch signal corresponding to said predetermined ramp signal when said means for detecting detects a zero width pulse indication, and means, responsive to said means for gating, for combining said latch signal and the corresponding pulse generated by said pulse edge modulation means during the period of said latch signal and said ramp portion for producing a zero width pulse during the full period of the latch signal and coincident said ramp portion of said predetermined ramp signal.

* * * * *